(12) United States Patent
Bräunlich et al.

(10) Patent No.: US 8,133,081 B2
(45) Date of Patent: Mar. 13, 2012

(54) AUTOMATION APPLIANCE HAVING A TERMINAL MODULE

(75) Inventors: Michael Bräunlich, Chemnitz (DE); Michael Chowaniec, Chemnitz (DE); Stefan Dausend, Schwabach (DE)

(73) Assignee: Siemens AG, München (DE)

( * ) Notice: Subject to any disclaimer, the term of this patent is extended or adjusted under 35 U.S.C. 154(b) by 112 days.

(21) Appl. No.: 12/787,115

(22) Filed: May 25, 2010

(65) Prior Publication Data

US 2010/0304602 A1 Dec. 2, 2010

(30) Foreign Application Priority Data

May 27, 2009 (EP) .................................... 09161207

(51) Int. Cl.
*H01R 9/22* (2006.01)
(52) U.S. Cl. ........................................ 439/717; 439/488
(58) Field of Classification Search .................. 439/488, 439/717
See application file for complete search history.

(56) References Cited

U.S. PATENT DOCUMENTS

| | | | | |
|---|---|---|---|---|
| 4,171,861 A | * | 10/1979 | Hohorst | 439/94 |
| 4,210,375 A | * | 7/1980 | Saligny | 439/65 |
| 5,775,955 A | | 7/1998 | Graube et al. | |
| 6,175,932 B1 | * | 1/2001 | Foote et al. | 714/5.11 |
| 6,262,561 B1 | * | 7/2001 | Takahashi et al. | 320/104 |
| 6,295,189 B1 | * | 9/2001 | Perelle et al. | 361/55 |
| 7,250,977 B2 | * | 7/2007 | Silverbrook et al. | 439/507 |
| 7,559,807 B2 | | 7/2009 | Freimuth et al. | |
| 7,574,268 B2 | | 8/2009 | Bräunlich et al. | |
| 2006/0216973 A1 | * | 9/2006 | Walmsley et al. | 439/83 |
| 2006/0234526 A1 | * | 10/2006 | Garrels et al. | 439/76.1 |
| 2007/0128895 A1 | * | 6/2007 | Kleyer et al. | 439/76.1 |
| 2010/0097085 A1 | * | 4/2010 | Takatori | 439/345 |

FOREIGN PATENT DOCUMENTS

| | | |
|---|---|---|
| DE | 198 07 710 | 9/1999 |
| DE | 10 2005 026 714 | 12/2006 |
| EP | 1 564 848 | 8/2005 |
| EP | 1 764 873 | 3/2007 |
| WO | WO 2004/068662 | 8/2004 |

\* cited by examiner

*Primary Examiner* — Briggitte R Hammond
(74) *Attorney, Agent, or Firm* — Cozen O'Connor

(57) ABSTRACT

An automation appliance includes a terminal module, in which a function module that is plugged into the terminal module, the automation device being suitable for modular extension by arranging in a row further terminal modules. The terminal module comprises a first holding device for holding the function module, a second holding device including a first contact device for holding a connecting module which has a second contact device, where a supply voltage for the function module is passable through the connecting module, and where a voltage monitoring device for monitoring the supply voltage is integrated in the function module.

12 Claims, 2 Drawing Sheets

AUTOMATION APPLIANCE HAVING A TERMINAL MODULE

BACKGROUND OF THE INVENTION

1. Field of the Invention

The invention relates to an automation appliance having a terminal module into which a function module can be plugged, the automation appliance being suitable for modular extension by arranging further terminal modules in a row, where the terminal module comprises a first holding device for holding the function module, a second holding device which has a first contact device, for holding a connecting module which has a second contact device, and where a supply voltage for the function module is passable through the connecting module.

2. Description of the Related Art

EP 1 764 873 A1 discloses a conventional automation appliance which can be constructed in a modular form, where the terminal module can make contact with a function module, and the terminal module can be connected to an adjacent terminal module.

DE 198 07 710 C2 also discloses a conventional automation appliance having a terminal module, function modules and a connecting module, where a supply voltage does not pass through the connecting module.

In such conventional automation appliances, which are preferably used to control industrial processes using a decentralized peripheral, a supply voltage for the individual terminal modules, into which function modules are in turn plugged, is provided by feed modules. For the purposes of the disclosed invention, a function module should be understood to mean, for example, an input/output assembly for application of input/output signals from the industrial process. In accordance with conventional automation appliances, the feed modules are plugged into a free plug slot from a terminal module, and then supply a group of further terminal modules that are connected to the feed module and in turn contain further function modules. Here, the load groups are formed by arranging the corresponding terminal modules in a row, and all the modules within one load group are fed from the same power supply unit. In the case of the automation appliance of DE 198 07 710 C2, as explained at paragraph 20 thereof, supply voltage is looped through the terminal modules from one terminal module to another.

This has the disadvantage that the feed modules each occupy their own plug slot, and changes to a supply voltage group or else a load group results in a group such as this being disconnected. A further disadvantage is that this plug slot is lost for actual automation tasks, which are intended to be performed by the function modules. In the past, various variants have been known for the modular design of such appliances in automation technology, for how to supply a supply voltage to a channel module or technology module. With these solutions, however, it is always necessary to sacrifice a "free" plug slot for a feed module.

SUMMARY OF THE INVENTION

It is therefore an object of the present invention to provide an automation appliance which occupies a smaller physical extent, and therefore has a smaller area requirement.

This and other objects and advantages are achieved by providing an automation appliance with means for monitoring the supply voltage that is integrated in the function module. As a result, it is possible to advantageously dispense with the need for feed modules. In conventional automation appliances, the supply voltage is monitored within the feed modules. In accordance with the invention, by moving monitoring of the supply voltage to the function modules, it is not necessary to have a separate feed module, and the plug slot of a terminal module normally used for a feed module can be used for an additional function module.

In an advantageous embodiment of the automation appliance, a first contact device includes a first connection, a second connection, a third connection and a fourth connection, which are arranged on a first and second face of the terminal module such that a further terminal module can be connected by its further first contact device to the first contact device. If the terminal module comprises a building-block component with a left-hand side, i.e., a first face, and a right-hand side, or a second face and a third face for snapping onto a mounting rack, such as a profiled rail, then each first face of a terminal module can be closely guarded on the second face of a predecessor terminal module, and can be connected to the first contact device arranged within the terminal modules. Furthermore, the first face of yet another terminal module can rest on the second face of the predecessor module, thus resulting in a modular configuration of the automation appliance which can in principle be of any desired length.

In this case, it is particularly advantageous to configure the contact device such that a combination of a first group, which comprises at least one terminal module, is connected to a first supply voltage. For the purposes of the described apparatus, the term "group" means that this group need not necessarily have three elements, which normally form a group, but, for the purposes of the disclosed embodiments of the invention, the groups may also consist of one terminal module with one function module, or may consist of a pair. When the terminal modules are plugged together, it is possible from a mechanical point of view to achieve a superordinate group, i.e., all the required terminal modules in the automation appliance are preferably already connected to one another mechanically, as performable, for example, by appropriate latching apparatuses on the terminal modules. Here, the first contact device in each terminal module is configured such that a first group of terminal modules is created by plugging on an appropriate connecting module with a second contact device, with these terminal modules being jointly associated with one common supply voltage. This is preferably achieved in that the first connection is connectable to the third connection, and the second connection is connectable to the fourth connection to pass on the supply voltage within a group to one another over bridges which are arranged in the connecting module.

In another embodiment, the third connection and the fourth connection are respectively connected to a first supply voltage terminal, which is arranged in the connecting module, and to a second supply voltage terminal, for connection of a supply voltage to define a starting point for the first group. A subsequent starting point for a second group is then formed by a further connecting module with supply voltage terminals and a correspondingly designed first contact device.

Here, a connecting module such as this, which can preferably be plugged as a separate terminal block onto the terminal module, includes at least one terminal apparatus for providing terminals for further signal lines. This terminal apparatus may comprise a screw terminal apparatus, an insulation-displacement terminal apparatus or a spring terminal apparatus. Accordingly, a terminal apparatus for signal lines is also arranged in a first type of connecting module, in addition to the terminals for the supply voltage. A second type of connecting module has no connecting terminals for the supply voltage, and space is therefore advantageously created for additional connecting terminals, to which further signal lines can be connected. Since, as already mentioned, there is no need for the feed modules in accordance with the disclosed embodiments, a freewheeling diode for arc suppression is advantageously arranged in the connecting module. In this case, it is also advantageous for a high-impedance ground link to be arranged in addition to the freewheeling diode to provide a floating configuration of a function module. Here, the freewheeling diode and the ground link are switched to be active only in the case of connecting modules that comprise feed modules.

In a floating configuration, the ground of the 24 V supply voltage is not necessarily connected with a low impedance to ground but, where there are a plurality of load groups, the 24 V acts on a common ground, which in many cases is not technically desirable.

The lack of a low-impedance connection to ground can lead to a potential difference being formed between the 24 V-potential of the power supply unit (24 V and ground) and the ground which can, in fact, be well over 100 V. This is primarily because electromagnetic fields in the surrounding area induce energy into the (24V) supply lines, which leads to an increase in the voltage both on the ground line and on the 24 V line to ground. Technically speaking, this will be common-mode interference since the two lines (24 V and ground) are laid parallel in one cable and are equally affected by the increase in potential. If they were laid separately in individual lines, which can in practice generally be precluded, this could also result in separate potential changes in the two lines and therefore in an increase in the voltage difference from nominally 24 V to considerably higher values (differential-mode interference), and this leads to operation of the protection circuit in the connecting module, with the excessively high voltage being disconnected. The energy feed by electromagnetic fields has a relatively high impedance. Consequently, a high-impedance link to ground is sufficient to dissipate these energies.

The connecting module is configured to simplify the capability of identifying the group combination in the plan view of the appliance to make it easier for an installer or a fitter for an automation installation to configure the automation appliance into different groups. Here, a first visual characteristic is preferably provided for a connecting module having a feed function for the supply voltage, and a second visual characteristic is provided for a connecting module having a function for passing on the supply voltage. A capability to identify the individual groups or load groups arising therefrom is therefore easier. Also feasible, for example, would be a black plastic block for feeding a supply voltage and a white plastic block for passing on the supply voltage. Furthermore, the connecting module comprises one physical unit, for example, as represented by a terminal block. For this purpose, this terminal block has a unit comprising terminals, a printed circuit board for the freewheeling diode, arc suppression, potential isolation and a peripheral connector for connecting the terminal block to the terminal module.

The disclosed embodiments in accordance with the invention thus make it possible, when a retrospective change is made to the modular design (i.e., the groups) to replace a terminal block, i.e., the connecting module, without pulling the terminal modules apart, thus creating a new group. The retrospective change to the load groups is now no longer made more difficult by the replacement of a complete terminal module.

Other objects and features of the present invention will become apparent from the following detailed description considered in conjunction with the accompanying drawings. It is to be understood, however, that the drawings are designed solely for purposes of illustration and not as a definition of the limits of the invention. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The drawings show exemplary embodiments of the automation appliance according to the invention, in which.

DETAILED DESCRIPTION OF THE PRESENTLY PREFERRED EMBODIMENTS

Figure 1:
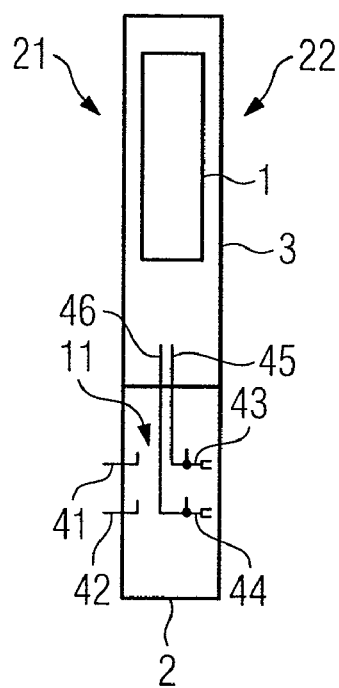
FIG. 1 shows a conventional terminal module.

FIG. 1 illustrates a terminal module 3 for an automation appliance 100 (see FIG. 4) for the modular configuration of the automation appliance 100. The terminal module 3 includes a first holding device 1 for holding a function module 4 (see FIG. 4), a second holding device 2 for holding a first connecting module 5 (see FIG. 2) or a second connecting module 5' (see FIG. 3). The first holding device 1 and the second holding device 2 comprise shafts, thus allowing the function module 4, the connecting module 5, 5' with contact elements configured as plugs to be plugged into a respective shaft for mechanical attachment and for making electrical contact. The terminal module 3 includes a first face 21 and a second face 22. Here, the terminal module 3 comprises a cuboid component with six faces. The first surface of the first face 21 may, for example, rest on a head assembly of the automation appliance 100, thus forming a starting point for the modular configuration of the automation appliance 100, with the further first face 21 of a further terminal module resting on the second face 22 of the terminal module 3, and each being connected by one first contact device 11 through the terminal modules.

The first contact device 11 includes a first connection 41, a second connection 42, a third connection 43 and a fourth connection 44. The first connection 41 and the second connection 42 are arranged in the terminal module such that one end of the first connection 41 and one end of the second connection 42 each project out of the cuboid housing of the terminal module 3, in order to make contact with another terminal module. A respective second end of the first connection 41 and of the second connection 42 are arranged with contact elements within the terminal module 3 and within the second holding device 2, respectively, such that a contact device, such as a bridge or feed terminals, can be plugged onto the second ends. The third connection 43 and the fourth connection 44 are configured such that one end of each of the connections 43, 44 is located within the housing of the terminal module 3 such that the first connection 41 and the second connection 42 of a further terminal module 3b can be plugged, by their respective first ends, into the respective first ends of the third and fourth connections of the predecessor terminal module 3. A first line 45 is connected to a second end of the third connection 43, and a second line 46 is connected to a second end of the connection 44. The first and the second lines 45, 46 are used to introduce the supply voltage into the terminal module 3 from the second holding device 2 into the first holding device 1.

A function module 4, which is plugged into the first holding device 1, is supplied with a supply voltage, which is connected and fed in by the first contact device 11, over the first line 45 and the second line 46. Here, the third connection 43 and the fourth connection 44 of the first contact device 11 are configured to hold a contact device which allows the supply voltage to be passed on through the connecting modules 5 and 5', respectively.

Figure 3:
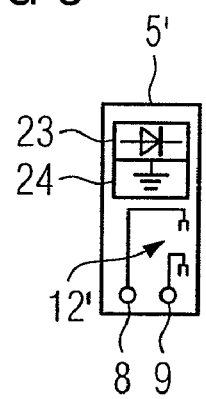
FIG. 3 shows a connecting module for feeding the supply voltage in accordance with an embodiment of the invention.

FIG. 3 shows a connecting module 5' for feeding a supply voltage into the terminal module 3. The connecting module 5' includes a second contact device 12'. Here, the second contact device 12' includes a first supply voltage terminal 8 and a second supply voltage terminal 9, with the supply voltage terminals 8, 9 being connected to contact elements which, when the connecting module 5' is plugged into the second holding device 2, contacts the first connection 43 and the second connection 44 by correspondingly configured contact elements, thus allowing a supply voltage to be fed in through the supply voltage terminals 8, 9, over the first line 45 and the second line 46, into the first holding device 1. It is thus ensured that the function module 4 is provided with the supply voltage when the function module 4 is plugged into the first holding device 1.

A freewheeling diode 23 comprising a feed module is arranged for arc suppression in the connecting module 5'. Furthermore, a high-impedance ground link 24 is arranged within the connecting module 5' for a floating design. The connecting module 5' comprises a physical unit having terminals for providing terminals for signal lines and supply voltage lines, a printed circuit board for the freewheeling diode 23, the high-impedance ground link 24, and for a peripheral link for connection of the connecting module 5' to opposing contacts arranged in a corresponding manner in the second holding device 2.

Figure 2:
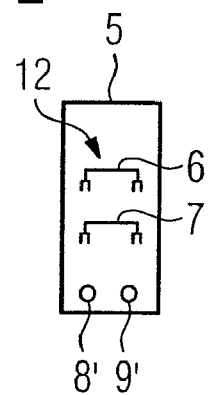
FIG. 2 shows a connecting module for passing on the supply voltage in accordance with an embodiment of the invention.

Here, the circuitry in the connecting module 5' is configured such that there is no contact with the connections 41 and 42 in the terminal module 2. The load voltage that is applied to the left-hand adjacent module is therefore not passed on but is interrupted, and simultaneously the load voltage which is connected to the terminals 8 and 9 is likewise not passed on to the left, thus effectively starting a new load group. The new load voltage is in turn applied to the contacts 43 and 44, where the next terminal module can use new load voltage, when an element as shown in FIG. 2 is present. However, if an element as shown in FIG. 3 is fitted to the right-hand adjacent terminal module, then a new load group would start there once again.

FIG. 2 shows a second type of connecting module 5. Here, the connecting module 5 includes a second contact device 12 having a first bridge 6 and a second bridge 7. Here, the bridges 6, 7 are configured such that, when the connecting module 5 is latched into or onto the second holding device 2, they connect the first connection 41 to the third connection 43, and the second connection 42 to the fourth connection 44. A supply voltage which is fed in by a predecessor terminal module is forwarded by the first bridge 6 from the first connection 41 to the second connection 43, and by the second bridge 7 from the second connection 42 to the fourth connection 44. The supply voltage terminals 8, 9, illustrated here as 8', 9', which are required for the first type of connecting module 5' as shown in FIG. 3, can now be used for further signal terminals, instead of feeding in a supply voltage.

Figure 4:
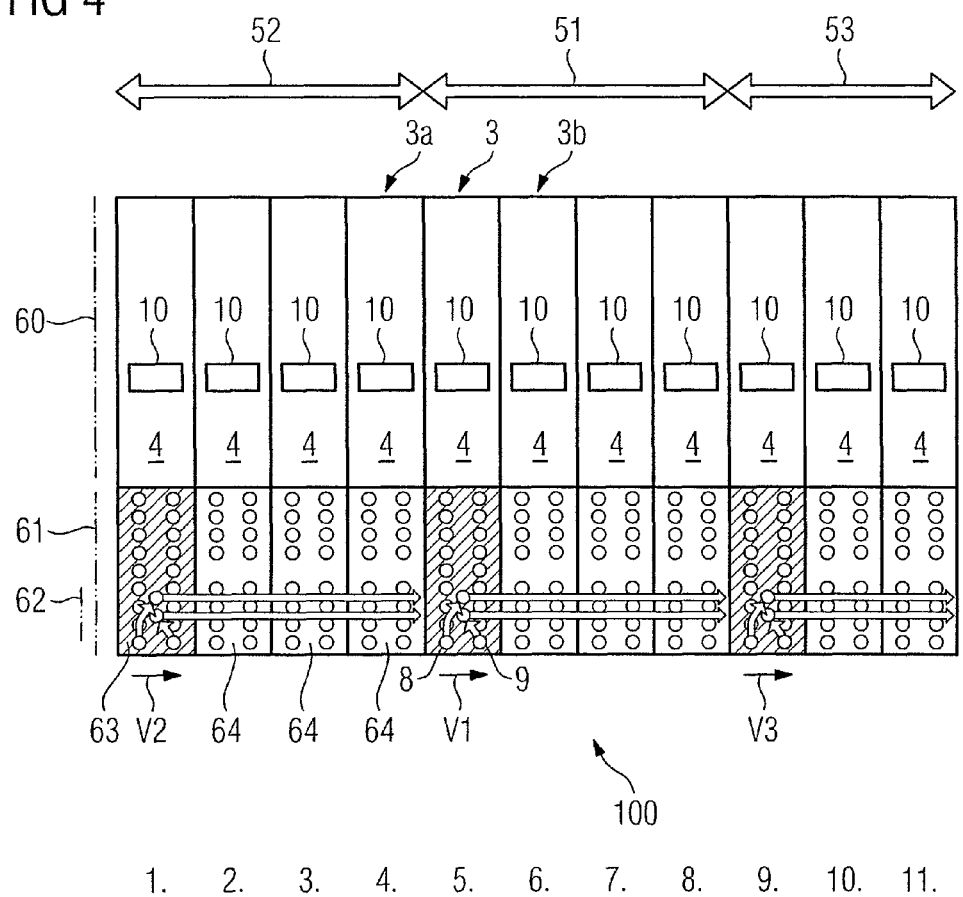
FIG. 4 shows an automation system of modular configuration with three load groups in accordance with an embodiment of the invention.

FIG. 4 shows a modular configuration of an automation appliance 100 having a first group 51, a second group 52 and a third group 53. Here, the automation appliance 100 includes 11 terminal modules arranged in a row. A function module 4 is plugged into each of these 11 terminal modules which are arranged in a row. In addition, each function module 4 includes a voltage monitoring device 10 for monitoring the supply voltage V1, V2, V3. Viewed from left to right, the first four terminal modules 3 with their plugged-in function modules 4 form a second group 52. The first terminal module 1 is provided with a feeding functionality for a starting point for the second group 52, by the plugged-in connecting module 5'. The supply voltage V2, which is fed in through the connecting module 5' of the first terminal module 1, is forwarded by further connecting modules with a forwarding functionality to the fourth terminal module, and to the fourth function module 4. A new group is opened from the fifth terminal module 3, specifically the first group 51, by a connecting module that is plugged into the fifth terminal module and that has a feeding functionality. The supply voltage V1 that is provided is forwarded to an eighth terminal module through corresponding connecting modules with a forwarded functionality.

A third supply voltage V3 is once again supplied by an appropriately configured connecting module with a feed functionality, by the ninth terminal module, which third supply voltage V3 is forwarded by the tenth and eleventh terminal modules having connecting modules with a forwarding functionality. The second group 52 comprises the first to fourth terminal modules. The first group 51 comprises the fifth to eighth terminal modules, and the third group 53 comprises the ninth to eleventh terminal modules.

The automation appliance 100 is subdivided into a module area 60, a terminal area 61 and a supply voltage area 62. The supply voltage area 62 can also be referred to as a powerbus or looped-through supply voltage lines. Here, the connecting modules 5, 5' are configured with their terminal area 61 such that, in addition to feed terminals 8, 9 for supply voltages V1, V2, V3, a plurality of terminals are also arranged to provide terminals for signal lines for signals from the industrial process.

In certain embodiments in which a connecting module 5' with a supply functionality is used, the lower two terminals 8, 9 of a connecting module are used to supply a supply voltage V1, V2, V3.

In a connecting module 5 with a forwarding functionality, the lower two feed terminals 8', 9' are not required for providing a supply voltage, and can therefore advantageously be used to provide terminals for further signal lines.

The combination of the terminal module 3 with appropriately configured first contact device 11, each connecting module 5, 5' which is plugged into the second holding device 2, and the plugged-in function module 4 with voltage monitoring device 10 arranged within the function module 4 for monitoring the supply voltage provide a synergistic interaction. As a result, one additional plug slot advantageously becomes free, because there is no longer any need to plug in a separate feed module, groups 51, 52, 53 can be formed independently into load groups or groups with different supply voltages. In addition, it is easier to convert an automation appliance 100, because there is now no longer any need to disturb the terminal modules on a profile rail to change the load groups.

Thus, while there are shown, described and pointed out fundamental novel features of the invention as applied to preferred embodiments thereof, it will be understood that various omissions and substitutions and changes in the form and details of the illustrated apparatus, and in its operation, may be made by those skilled in the art without departing from the spirit of the invention. Moreover, it should be recognized that structures shown and/or described in connection with any disclosed form or embodiment of the invention may be incorporated in any other disclosed or described or suggested form or embodiment as a general matter of design choice.

What is claimed is:

1. An automation appliance, comprising:
a terminal module; and
a function module plugged into the terminal module, the automation appliance being modularly extendable by arranging in a row and adjacent to the terminal module further terminal modules, the terminal module comprising:
a first holding device for holding the function module; and
a second holding device including a first contact device for holding a connecting module having a second contact device, a supply voltage for the function module being passable through the connecting module;
wherein a voltage monitoring device for monitoring the supply voltage is integrated in the function module.

2. The automation appliance as claimed in claim 1, wherein the first contact device includes a first connection, a second connection, a third connection and a fourth connection, which are arranged on a first face and second face of the terminal module such that a further terminal module is connectable to the first contact device by a further first contact device of the further terminal module.

3. The automation appliance as claimed in claim 1, wherein the first contact device is configured such that a combination of a first group of terminal modules, which comprises at least one terminal module, is connected to a first supply voltage.

4. The automation appliance as claimed in claim 2, wherein the first contact device is configured such that a combination of a first group of terminal modules, which comprises at least one terminal module, is connected to a first supply voltage.

5. The automation appliance as claimed in claim 3, wherein the first connection is connectable to the third connection, and the second connection is connectable to the fourth connection forming bridges to forward the first supply voltage from one terminal module to another terminal module within the group of terminal modules through the bridges arranged in the connecting module.

6. The automation appliance as claimed in claim 2, wherein the third connection and the fourth connection are respectively connectable to a first supply voltage terminal and a second supply voltage terminal arranged in the connecting module for connection of a supply voltage.

7. The automation appliance as claimed in claim 3, wherein the third connection and the fourth connection are respectively connectable to a first supply voltage terminal and to a second supply voltage terminal arranged in the connecting module for connection of the supply voltage.

8. The automation appliance as claimed in claim 1, wherein the connecting module includes at least one terminal apparatus having terminals for further signal lines for the function module, the terminals comprising at least one of a screw terminal apparatus, an insulation-displacement terminal apparatus and a spring terminal apparatus.

9. The automation appliance as claimed in claim 1, wherein a freewheeling diode for arc suppression is arranged in the connecting module.

10. The automation appliance as claimed in claim 1, wherein a high-impedance ground link is arranged in the connecting module to provide a floating configuration for the function module.

11. The automation appliance as claimed in claim 1, wherein the connecting module is configured such that group combinations of the terminal modules are perceptible in a plan view of the automation appliance.

12. The automation applicant as claimed in claim 11, wherein, so that the group combinations of the terminal modules are perceptible in a plan view of the automation appliance, each the connecting modules comprises one of a first visual characteristic for identifying a connecting module having a feed function for the supply voltage and a second visual characteristic for identifying a connecting module having a function of forwarding the supply voltage.

* * * * *